United States Patent
Hua et al.

(10) Patent No.: US 11,221,422 B2
(45) Date of Patent: Jan. 11, 2022

(54) PIXEL STRUCTURE OF FLAT PANEL DETECTION DEVICE, FLAT PANEL DETECTION DEVICE AND CAMERA SYSTEM

(71) Applicants: Beijing BOE Optoelectronics Technology Co., Ltd., Beijing (CN); BOE Technology Group Co., Ltd., Beijing (CN)

(72) Inventors: Gang Hua, Beijing (CN); Wang Guo, Beijing (CN); Yanna Xue, Beijing (CN); Yong Zhang, Beijing (CN); Lu Bai, Beijing (CN); Haobo Fang, Beijing (CN); Jian Lin, Beijing (CN); Limin Zhang, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/767,008

(22) PCT Filed: Dec. 24, 2019

(86) PCT No.: PCT/CN2019/127691
§ 371 (c)(1),
(2) Date: May 26, 2020

(87) PCT Pub. No.: WO2020/140790
PCT Pub. Date: Jul. 9, 2020

(65) Prior Publication Data
US 2021/0223418 A1  Jul. 22, 2021

(30) Foreign Application Priority Data
Jan. 4, 2019  (CN) .......................... 201910009421.3

(51) Int. Cl.
*G01T 1/24* (2006.01)
*H01L 31/0203* (2014.01)
(Continued)

(52) U.S. Cl.
CPC .......... *G01T 1/247* (2013.01); *H01L 31/0203* (2013.01); *H01L 31/085* (2013.01); *H04N 5/32* (2013.01)

(58) Field of Classification Search
CPC ... G01T 1/247; H01L 31/0203; H01L 31/085; H04N 5/32
See application file for complete search history.

(56) References Cited

U.S. PATENT DOCUMENTS 8,035,106 B2  10/2011  Kawachi
8,063,963 B2  11/2011  Dierickx
(Continued)

FOREIGN PATENT DOCUMENTS

CN  101140940 A  3/2008
CN  101149893 A  3/2008
(Continued)

OTHER PUBLICATIONS

Feb. 6, 2020—(CN) First Office Action Appn 201910009421.3 with English Translation.

*Primary Examiner* — Hugh Maupin
(74) *Attorney, Agent, or Firm* — Banner & Witcoff, Ltd.

(57) ABSTRACT

A pixel structure of flat panel detection device, a flat panel detection device, and a camera system. The pixel structure of the flat panel detection device includes a photodiode configured to collect optical signals and convert the optical signals into electrical signals, the photodiode includes a positive terminal and a negative terminal, the negative terminal is connected to a bias voltage signal terminal; a signal amplification circuit, a signal input terminal of the
(Continued)

signal amplification circuit is connected to the negative terminal of the photodiode, a signal output terminal of the signal amplification circuit is connected to a first node; a first switching transistor, a control electrode of the first switching transistor is connected to a scanning signal line, a first terminal of the first switching transistor is connected to a data signal line, and a second terminal of the first switching transistor is connected to the first node.

19 Claims, 4 Drawing Sheets

(51) Int. Cl.
*H01L 31/08* (2006.01)
*H04N 5/32* (2006.01)

(56) References Cited

U.S. PATENT DOCUMENTS

| | | | |
|---|---|---|---|
| 9,500,752 | B2 | 11/2016 | Mollov |
| 9,681,074 | B2 | 6/2017 | Duan et al. |
| 10,068,543 | B2 | 9/2018 | Yamamoto et al. |
| 10,121,448 | B2 | 11/2018 | Kimura et al. |
| 10,217,399 | B2 | 2/2019 | Kim et al. |
| 10,373,581 | B2 | 8/2019 | Kimura et al. |
| 2002/0056810 | A1* | 5/2002 | Kobayashi ........ H01L 27/14659 250/370.09 |
| 2008/0164473 | A1* | 7/2008 | Tai ................... H01L 27/14678 257/59 |
| 2009/0321643 | A1* | 12/2009 | Rutten ............. H01L 27/14658 250/338.4 |
| 2012/0018627 | A1* | 1/2012 | Tredwell ................ H04N 5/361 250/252.1 |
| 2020/0049839 | A1 | 2/2020 | Zhang et al. |

FOREIGN PATENT DOCUMENTS

| | | |
|---|---|---|
| CN | 104867431 A | 8/2015 |
| CN | 105340021 A | 2/2016 |
| CN | 105594199 A | 5/2016 |
| CN | 107707243 A | 2/2018 |
| CN | 109061713 A | 12/2018 |
| CN | 109655877 A | 4/2019 |
| EP | 2492781 A1 | 8/2012 |
| JP | 5042279 B2 | 10/2012 |

\* cited by examiner

PIXEL STRUCTURE OF FLAT PANEL DETECTION DEVICE, FLAT PANEL DETECTION DEVICE AND CAMERA SYSTEM

CROSS-REFERENCE TO RELATED APPLICATIONS

The application is a U.S. National Phase Entry of International Application No. PCT/CN2019/127691 filed on Dec. 24, 2019, designating the United States of America and claiming priority to Chinese Patent Application No. 201910009421.3 filed on Jan. 4, 2019. The present application claims priority to and the benefit of the above-identified applications and the above-identified applications are incorporated by reference herein in their entirety.

TECHNICAL FIELD

Embodiments of the present disclosure relate to a pixel structure of a flat panel detection device, a flat panel detection device, and a camera system.

BACKGROUND

Digital X-ray (Digital Radiography, DR) technology is widely used in medical equipment, such as X-ray machines for emitting X-ray. The key component of the DR device is a flat panel detection device for collecting images, and its performance will greatly effect on the quality of the DR images.

SUMMARY

Embodiments of the present disclosure provide a pixel structure of a flat panel detection device, a flat panel detection device, and a camera system.

At least one embodiment of the present disclosure provides a pixel structure of a flat panel detection device, comprising: a photodiode configured to collect optical signals and convert the optical signals into electrical signals, the photodiode comprises a positive terminal and a negative terminal, and the negative terminal is connected to a bias voltage signal terminal; a signal amplification circuit, a signal input terminal of the signal amplification circuit is connected to the negative terminal of the photodiode, and a signal output terminal of the signal amplification circuit is connected to a first node; and a first switching transistor, a control electrode of the first switching transistor is connected to a scanning signal line, a first terminal of the first switching transistor is connected to a data signal line, and a second terminal of the first switching transistor is connected to the first node.

For example, the signal amplification circuit comprises: a second switching transistor, a control electrode of the second switching transistor is connected to a first voltage signal terminal, a first terminal of the second switching transistor is connected to a second voltage signal terminal, a second terminal of the second switching transistor is connected to a second node, and the second node and the first node are connected together to become one node; a third switching transistor, a control electrode of the third switching transistor is connected to the second node, and a first terminal of the third switching transistor is the signal input terminal of the signal amplification circuit; and a bootstrap circuit, one terminal of the bootstrap circuit is connected to the second terminal of the third switching transistor, and the other terminal of the bootstrap circuit is the signal output terminal of the signal amplification circuit.

For example, the bootstrap circuit is a capacitor.

For example, the photodiode is a metal-semiconductor-metal type photodiode structure.

For example, the third switching transistor is an n-type thin film transistor.

For example, the photodiode is a PIN-type photodiode structure.

For example, the third switching transistor is a p-type thin film transistor.

For example, the pixel structure further comprises an X-ray conversion layer disposed on the photodiode, and the X-ray conversion layer is configured to convert a X-ray into an optical signal.

For example, the pixel structure further comprises a signal readout circuit, and the signal readout circuit is connected to the data signal line.

For example, the X-ray conversion layer is made of gadolinium oxysulfide or cesium iodide material.

For example, the metal-semiconductor-metal type photodiode structure comprises: a substrate; a gate electrode and a first ground layer formed on the substrate; a gate insulating layer formed on the gate electrode and the first ground layer; a first active layer formed on the gate insulating layer corresponding to the gate electrode; a source-drain layer formed on the first active layer; a first intermediate insulation layer formed on the source-drain layer; a first via hole formed in the first intermediate insulation layer; a second ground layer formed on the first intermediate insulation layer; a second intermediate insulation layer formed on the second ground layer and the first intermediate insulation layer; a second via hole formed in the second intermediate insulation layer, and the second via hole is communicated with the first via hole; an electrode formed on the second intermediate insulation layer; and a second active layer formed on the second intermediate insulation layer and the electrode.

For example, the PIN-type photodiode structure comprises: a substrate; a gate electrode formed on the substrate; a gate insulating layer formed on the gate electrode; an active layer formed on the gate insulating layer corresponding to a position of the gate electrode; a source-drain layer formed on the active layer; a first passivation layer formed on the source-drain layer; a second source-drain layer formed on the first passivation layer; a PIN junction formed on the second source-drain layer; an ITO cover layer formed on the PIN junction; an intermediate insulation layer formed on the ITO cover layer; a second passivation layer formed on the intermediate insulation layer; a shielding layer formed on the second passivation layer; and a protective layer formed on the shielding layer. The X-ray conversion layer is formed on the protective layer.

At least one embodiment also provides a flat panel detection device, comprising the pixel structure of the flat panel detection device.

At least one embodiment also provides a camera system, comprising the flat panel detection device.

BRIEF DESCRIPTION OF THE DRAWINGS

The embodiments of the present disclosure will be described in more detail below with reference to the accompanying drawings, so that those skilled in the art can more clearly understand the embodiments of the present disclosure, in which.

DETAILED DESCRIPTION

Figure 1A:
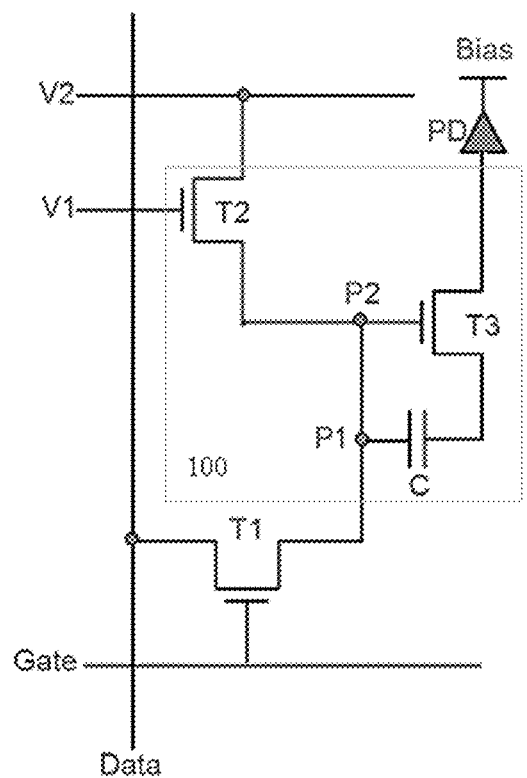
FIG. 1A is a circuit diagram of a pixel structure of a flat panel detection device provided by an embodiment of the present disclosure.

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure. It should be noted that the same or similar reference numerals throughout indicate the same or similar elements or elements having the same or similar functions. The embodiments described below with reference to the drawings are exemplary, which are provided only for the purpose of explaining the present disclosure, and should not be construed as limiting the present disclosure. It is to be noted that same or similar reference numerals represent same or similar elements or elements with same or similar functions throughout the context. Embodiments described with reference to the drawings are exemplary embodiments, which are used for explaining the disclosure, and cannot be understood as a limitation to the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," etc. are only used to indicate relative position relationship, and when the absolute position of the object which is described is changed, the relative position relationship may be changed accordingly.

An important evaluation index of the performance of the flat panel detection device is the signal-to-noise ratio (SNR), that is, the larger the amount of signals is and the smaller the noise is, the better the detection effect of the flat panel detection device is. However, in the process of collecting images, the bones and soft tissues of the human body absorb a large amount of X-rays. As a result, when this part of the signals reaches the surface of the flat panel detection device, the amount of the signals is extremely low, so the effective amount of signals collected and converted is low. Although the terminal obtains information about bones and soft tissues through the reverse processing of the image, the signals are greatly affected by noise due to the lower amount of signals collected previously, that is, this part of the signals is easily contaminated, which reduces the detection effect of the flat panel detection device, and reduce the quality of the obtained image.

Embodiments of the present disclosure provide a pixel design method of an X-ray detection device. In addition to other structures to be discussed below, the use of two TFTs and one capacitor to increase the detection ray signal is beneficial to improve the signal-to-noise ratio (SNR) of the flat panel detection device. For example, the solutions of the embodiments of the present disclosure are suitable for pixel designs with high fill rates, such as MSM-type FPXD (Flat Panel X-ray Detection) and full-layer PIN-type FPXD products, and the increased pixels do not decrease the additional pixels fill rate.

The embodiments of the present disclosure provide a pixel structure of a flat panel detection device. The flat panel detection device can be applied to a camera system of a medical device, such as a CCD (Charge Coupled Device) camera system, CMOS (Complementary Metal Oxide Semiconductor) camera system. The flat panel detection device may be an X-ray flat panel detection device, and the X-ray flat panel detection device may be divided into two types, i.e., a direct conversion type or an indirect conversion type.

As illustrated in FIG. 1A, the pixel structure of the flat panel detection device may include a photodiode PD, a signal amplification circuit, and a first switching transistor T1. The photodiode PD is used to collect an optical signal and convert the optical signal into an electrical signal, the photodiode PD has a positive terminal and a negative terminal, and the negative terminal is connected to a bias voltage signal terminal Bias; a signal input terminal of the signal amplification circuit is connected to the negative terminal of the photodiode PD, a signal output terminal of the signal amplification circuit is connected to a first node P1; a control electrode of the first switching transistor T1 is connected to a scanning signal line Gate, a first terminal of the first switching transistor T1 is connected to a data signal line Data, and a second terminal of the first switching transistor T1 is connected to the first node P1.

In this embodiment, the photodiode PD has a unidirectional conductivity, and the photodiode PD works under the action of a reverse voltage. This photodiode PD can convert collected optical signals into electrical signals, that is, the photodiode PD will generate hole electron pairs when exposed to light. Under the action of an external bias field, the electron and hole pairs move in opposite directions to form current, and the current forms stored charges in the storage capacitor of the photodiode PD. When a scan signal written through the scan signal line Gate causes the first switching transistor T1 to be turned on, the photodiode PD can output a given voltage signal to the signal amplification circuit and this voltage signal can be amplified by the signal amplification circuit and then output to the data line Data. In other words, in this process, the signal amplification circuit is provided between the photodiode PD and the first switching transistor T1 to increase the actual signal output to the data line Data, that is, the detection signal of the flat panel detection device is increased, which is beneficial to improve the signal-to-noise ratio of the flat panel detection device, improve the detection effect of the flat panel detection device and improve the quality of the obtained images.

For example, as shown in FIG. 1A, the signal amplification circuit 100 (as shown in the shallow frame in FIG. 1A) may include a second switching transistor T2; a third switching transistor T3; and a bootstrap circuit, such as a capacitor C. A control electrode of the second switching transistor T2 is connected to a first voltage signal terminal V1, a first terminal of the second switching transistor T2 is connected to a second voltage signal terminal V2, and a second terminal of the second switching transistor T2 is connected to a second node P2. The second node P2 is connected to the first node P1, so the two nodes can be regarded as one node. A control electrode of the third switching transistor T3 is connected to the second node P2, and a first terminal of the third switching transistor T3 is the signal input terminal of the signal amplification circuit; a second terminal of the third switching transistor T3 is connected to one terminal of the bootstrap circuit, and the other terminal of the bootstrap circuit is the signal output terminal of the signal amplification circuit.

The bootstrap circuit, also referred to a boost circuit, makes use of electronic components, such as a bootstrap boost diode or a bootstrap boost capacitor, to superimpose the capacitor discharge voltage and the power supply voltage, so as to increase the voltage.

In this embodiment, the signal amplification circuit amplifies the voltage signals output by the photodiode PD by using two switching transistors in combination with a bootstrap circuit. This design can simplify the difficulty of making the signal amplification circuit and reduce the space occupied by the signal amplification circuit, which can alleviate the situation that this signal amplification circuit occupies the space of other pixels, and ensure the pixel fill rate of the flat panel detection device.

Based on the above embodiment, the working principle of the pixel structure of the flat panel detection device may be as follows: when exposed to light, the photodiode PD collects optical signals and converts the optical signals into electrical signals for storing the electrical signals in its own capacitance; when a scan signal causes the first switching transistor T1 to be turned on, a first voltage is applied to the control electrode of the second switching transistor T2 through the first voltage signal terminal V1 to turn on the second switching transistor T2, so that a second voltage written through the second voltage signal terminal V2 is applied to the control electrode of the third switching transistor T3 to turn on the third switching transistor T3; when the third switching transistor T3 is turned on, the voltage signal output by the photodiode PD can be input to the bootstrap circuit through the third switching transistor T3, and output to the data line Data through the first switching transistor T1 after being boosted by the bootstrap circuit, which realize the amplification of the signals.

For example, as illustrated in FIG. 1A, the aforementioned bootstrap circuit may be a capacitor C, and the amplification of the signals may be realized by using the characteristics that the voltage across the capacitor C cannot be changed abruptly. In other words, when there is a given voltage difference between the two terminals of the capacitor C, the voltage at the input terminal (this terminal is the terminal of the capacitor C that is connected to the second terminal of the third switching transistor T3) of the capacitor C is increased, the voltage at the output terminal (this terminal is the signal output terminal of the aforementioned signal amplification circuit) of the capacitor C still maintains the original voltage difference relative to the input terminal, which is equivalent to the voltage at the output terminal of the capacitor C being lifted by its input terminal, which realizes the amplification of the signals.

In this embodiment, the use of the capacitor C to amplify the signals can further simplify the difficulty of making the signal amplification circuit and reduce the space occupied by the signal amplification circuit, which can alleviate the situation that this signal amplification circuit occupies the space of other pixels, which ensures the pixel fill rate of the flat panel detection device.

For example, the photodiode PD may be an MSM (Metal-Semiconductor-Metal) type photodiode. This MSM-type photodiode refers to a device in which metal electrodes are formed on the semiconductor surface to form metal-semiconductor Schottky contacts. This MSM-type photodiode has a unique planar structure that makes the photodiode extremely easy for photoelectric integration, and has the characteristics of high bandwidth and high speed. For example, this MSM-type photodiode can be made of indium gallium arsenide (InGaAs) material. The MSM-type photodiode has a wide response wavelength range, can work efficiently at room temperature, and has excellent characteristics, such as low dark current, high response speed, and high sensitivity.

The voltage signal output by the MSM photodiode is usually a positive voltage signal. Therefore, in order to amplify the positive voltage signal output by the MSM-type photodiode to a greater positive voltage, the third switching transistor T3 may be an n-type thin film transistor. In addition, the first switching transistor T1 and the second switching transistor T2 may also be n-type thin film transistors.

In this embodiment, the negative terminal of the MSM photodiode can be written into a positive voltage through the bias voltage signal terminal bias. For example, the positive voltage may be about 200V, but the embodiment of the present disclosure is not limited thereto. When not exposed to light, the MSM-type photodiode is in the 'off' state, in this case, the first switching transistor T1, the second switching transistor T2, and the third switching transistor T3 can be turned on, and an initial voltage value is written to the positive terminal of the MSM-type photodiode and the two terminals of the capacitor C through the data line Data. This initial voltage value may be, for example, about 1V, but the embodiment of the present disclosure is not limited thereto. When exposed to light, the MSM-type photodiode can convert the optical signals into electrical signals to make itself in a working state. In this case, the initial voltage value of the positive terminal of the MSM-type photodiode gradually approaches the voltage value at its negative terminal, that is, the voltage value at the positive terminal of the MSM-type photodiode (hereinafter referred to as the output voltage) becomes larger. When the scan signal written through the scan signal line Gate causes the first switching transistor T1 to be turned on, the first voltage is applied to the control electrode of the second switching transistor T2 through the first voltage signal terminal V1 to turn on the second switching transistor T2, so that the second voltage written through the second voltage signal terminal V2 is applied to the output terminal of the capacitor C through the second node P2 and the first node P1 sequentially, which causes the two terminals of the capacitor C have a given voltage difference, and the second voltage is applied to the control electrode of the third switching transistor T3 through the second node P2 to turn on the third switching transistor T3; when the third switching transistor T3 is turned on, the output voltage at the positive terminal of the MSM-type photodiode can be input to the input terminal of the capacitor C through the third switching transistor T3, that is, the voltage at the input terminal of the capacitor C becomes larger; at this moment, the voltage of the output terminal of the capacitor C also increases in order to maintain the inherent voltage difference of the capacitor C.

It is to be noted that, as mentioned above, in the case where the photodiode PD is an MSM-type photodiode, both the second switching transistor T2 and the third switching transistor T3 may be n-type thin film transistors. In this way, to turn on the second switching transistor T2 and the third switching transistor T3, the voltages written by both the first voltage signal terminal V1 and the second voltage signal terminal V2 may both be positive voltages.

Figure 3:
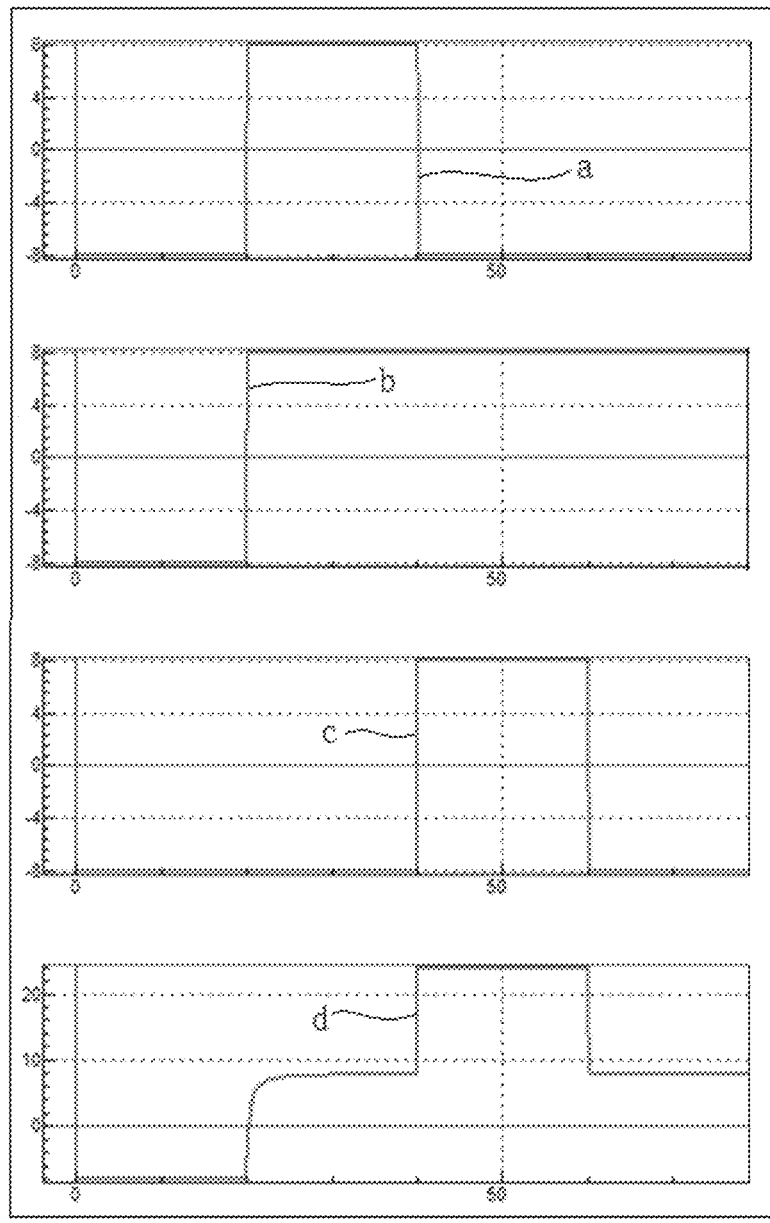
FIG. 3 is a circuit signal simulation diagram of a pixel structure of a flat panel detection device provided by an embodiment of the present disclosure.

For example, in the case where the photodiode PD is an MSM-type photodiode, a circuit signal simulation diagram of the pixel structure may be as shown in FIG. 3. The abscissa in FIG. 3 represents the timing, and the unit is microseconds (vs); the longitudinal ordinate in FIG. 3 represents voltages, and the unit is volts (V); the a in FIG. 3 represents the change process of the voltage written by the first voltage signal terminal V1 over time, the b in FIG. 3 represents the change process of the voltage written by the second voltage signal terminal V2 over time, the c in FIG. 3 represents the change process of the voltage output from the output terminal of the MSM-type photodiode over time, and the d in FIG. 3 represents the change process of the voltage output from the output terminal of the capacitor C over time. For example, as can be seen from FIG. 3, the voltage output by the MSM-type photodiode can be increased from a set voltage of about 8V to about 22V by adjusting the timing of the signal, that is, the voltage output by the signal amplification circuit is about 22V at this moment, but the embodiment of the present disclosure is not limited thereto.

Figure 1B:
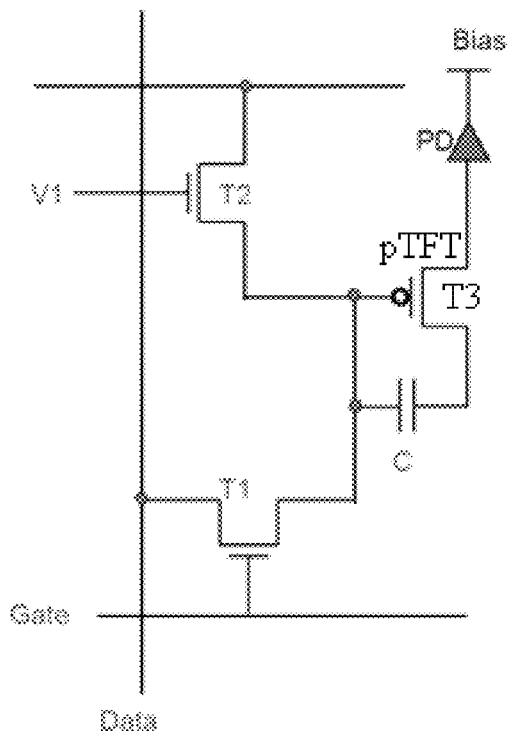
FIG. 1B is a circuit diagram of a pixel structure of a flat panel detection device provided by an embodiment of the present disclosure, where T3 is a p-type transistor.

In another example embodiment, the photodiode PD may be a PIN-type photodiode. This PIN-type photodiode has the advantages of small junction capacitance, short transit time, high sensitivity, etc., and low noise. The voltage signal output by the PIN-type photodiode is usually a negative voltage signal (this negative voltage signal includes 0V). In this way, to amplify the negative voltage signal output by the PIN photodiode to a smaller value (which refers to that the negative value of the voltage signal is smaller while the absolute value of the voltage signal is greater), the third switching transistor T3 may be a p-type thin film transistor, and as shown in FIG. 1B, the first switching transistor T1 and the second switching transistor T2 may be n-type thin film transistors. For example, the third switching transistor may be a n-type thin film transistor. The configurations of the above-mentioned transistors may be same as a p-type or n-type transistor in the related art.

Figure 4:
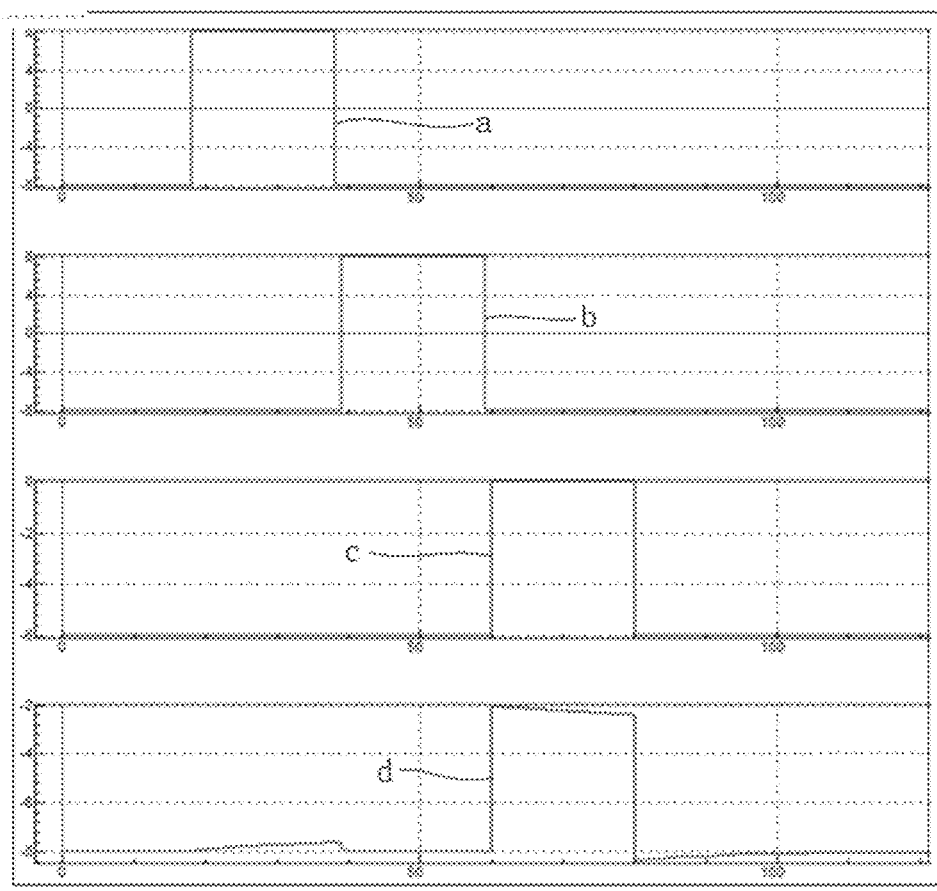
FIG. 4 is a circuit signal simulation diagram of a pixel structure of a flat panel detection device provided by an embodiment of the present disclosure.

In this embodiment, the negative terminal of the PIN-type photodiode can be written into a negative voltage through the bias voltage signal terminal Bias. This negative voltage may be about −6V, but the embodiments of the present disclosure are not limited thereto. When not exposed to light, the PIN-type photodiode is in the 'off' state. In this case, the first switching transistor T1, the second switching transistor T2, and the third switching transistor T3 can be turned on, and an initial voltage value can be written to the positive terminal of the PIN-type photodiode and the two terminals of the capacitor C through the data line Data. This initial voltage value may be about 1V, but the embodiments of the present disclosure are not limited thereto. When exposed to light, the PIN-type photodiode can convert the optical signals into electrical signals to make itself in a working state. In this case, the initial voltage value of the positive terminal of the PIN-type photodiode gradually approaches the voltage at the negative terminal of the photodiode, that is, the voltage value at the positive terminal of the PIN type photodiode (hereinafter referred to as the output voltage) becomes smaller. As shown in FIG. 4, the output voltage of this PIN-type photodiode can become 0, but the embodiments of the present disclosure are not limited thereto, and the output voltage of this PIN-type photodiode may be smaller.

When the scan signal written through the scan signal line Gate causes the first switching transistor T1 to be turned on, the first voltage (As shown in FIG. 4, this first voltage may be about 8V, but the embodiment of the present disclosure is not limited to thereto) is applied to the gate electrode of the second switching transistor T2 through the first voltage signal terminal V1 to turn on the second switching transistor T2, so that the second voltage written through the second voltage signal terminal V2 is applied to the output terminal of the capacitor C through the second node P2 and the first node P1 sequentially, which causes the two terminals of the capacitor C have a given voltage difference, and the second voltage (as shown in FIG. 4, the second voltage may be about −8V, but the embodiments of the present disclosure are not limited thereto) is applied to the control electrode of the third switching transistor T3 through the second node P2 to turn on the third switching transistor T3; when the third switching transistor T3 is turned on, the output voltage at the positive terminal of the PIN-type photodiode can be input to the input terminal of the capacitor C through the third switching transistor T3, that is, the voltage at the input terminal of the capacitor C becomes smaller, for example, the voltage at the input terminal of the capacitor C changes from about 1V to 0V; at this moment, the voltage of the output terminal of the capacitor C also decreases to maintain the inherent voltage difference of the capacitor C.

For example, when the photodiode PD is a PIN-type photodiode, a circuit signal simulation diagram of the pixel structure may be as shown in FIG. 4, the abscissa in FIG. 4 represents the time/timing, and the unit is microsecond (vs); the longitudinal ordinate in FIG. 4 represents the voltage, and the unit is volt (V); the a in FIG. 4 represents the change process of the voltage written by the first voltage signal terminal V1 over time, the b in FIG. 4 represents the change process of the voltage written by the second voltage signal terminal V2 over time, the c in FIG. 4 represents the change process of the voltage output from the output terminal of the PIN-type photodiode over time, and the d in FIG. 4 represents the change process of the voltage output from the output terminal of the capacitor C over time. As can be seen from FIG. 4, the output voltage of the PIN-type photodiode can be reduced from the set 0V to about −2V by adjusting the timing of the signal, that is, the negative voltage signal output by the PIN photodiode is further amplified to a smaller (a greater absolute value) voltage.

Figure 2A:
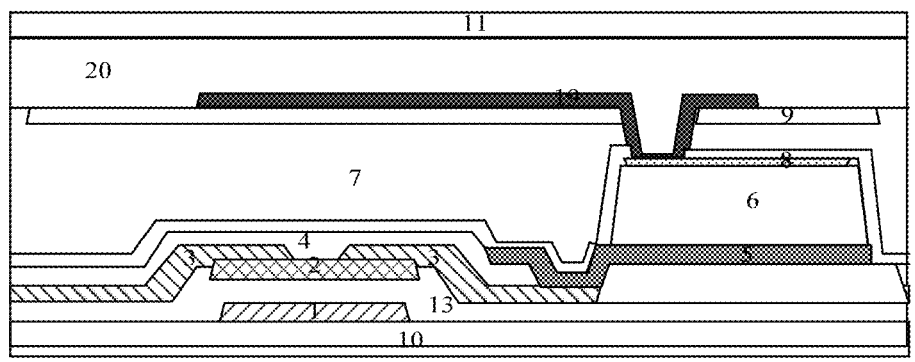
FIG. 2A is a PIN photodiode structure with an X-ray conversion layer provided by an embodiment of the present disclosure.

For example, the pixel structure may further include an X-ray conversion layer. As shown in FIG. 2A, a PIN-type photodiode structure with a X-ray conversion layer is shown. The X-ray conversion layer is provided on the photodiode. The X-ray conversion layer is used to convert X-rays into optical signals, that is, this pixel structure can be applied to an X-ray flat panel detection device.

It is to be noted that the X-ray conversion layer may be directly provided on the photodiode or indirectly provided on the photodiode.

As shown in FIG. 2A, the PIN-type photodiode structure with the X-ray conversion layer includes a substrate 10, such as a glass substrate, a gate electrode 1 formed on the substrate 10, a gate insulating layer 13 formed on the gate electrode 1, an active layer 2 formed on the gate insulating layer 13 corresponding to the position of the gate electrode, a source-drain layer 3 formed on the active layer 2, a first passivation layer 4 formed on the source-drain layer 3, a second source-drain layer 5 formed on the first passivation layer 4, a PIN junction 6 formed on the second source-drain layer 5, the PIN junction 6 formed on the second source-drain layer 5, an ITO cover layer 8 formed on the PIN junction 6, and an intermediate insulation layer 7, such as a resin layer 7. In addition, the structure may further include a second passivation layer 9 formed on the intermediate insulation layer 7. A shielding layer, such as a metal shielding layer, may also be formed on the second passivation layer 9. In addition, for example, a protective layer 20, such as a resin protective layer, for protecting the panel, as well as a nitride barrier layer, an ITO pad layer, etc. may also be formed. For example, in addition, an X-ray protective layer 11 is formed on the protective layer 20. For example, the X-ray conversion layer can be formed by using GdOS (gadolinium oxysulfide) or CsI (cesium iodide) material. The X-ray conversion layer is configured to convert X-rays to visible light. For example, the X-ray conversion layer is formed by a coating process or a deposition process, but the embodiments of the present disclosure are not limited thereto. For another example, a via hole may also be formed in the intermediate insulation layer and the second passivation layer 9, and a bias metal line 19 is connected to the ITO cover layer 8 through the via hole.

The active layer in the figures refers to an I layer in the PIN, i.e., an intrinsic layer grown in the PN junction, which performs photoelectric conversion effect on the light obtained by X-ray conversion.

Figure 2B:
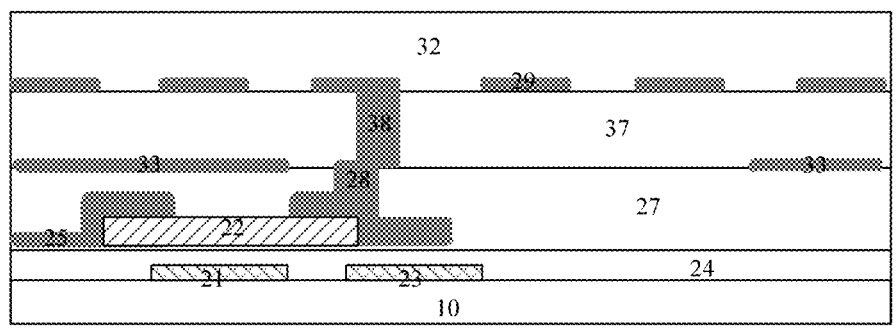
FIG. 2B is a schematic diagram of the structure of an MSM-type photodiode provided by an embodiment of the present disclosure.

FIG. 2B illustrates a MSM metal semiconductor photoelectric conversion device. For example, the MSM metal semiconductor photoelectric conversion device may include a substrate 10, such as a glass substrate; a gate electrode 21 and a first ground layer 23 formed on the substrate 10, for example, the gate electrode 21 and the first ground layer 23 may be formed of the same metal material in the same process; a gate insulating layer 24 formed on the gate electrode 21 and the first ground layer 23; a first active layer formed on the gate insulating layer 24 corresponding to the gate electrode 21, for example, the first active layer is a-Si; a source-drain layer 25 formed on the first active layer; a first intermediate insulation layer 27 formed on the source-drain layer 25, the first insulation layer may be formed of, for example, a resin material; a first via hole 28 formed in the first intermediate insulation layer 27; a second ground layer 33 formed on the first intermediate insulation layer 27, for example, the second ground layer 33 may be formed of the same material as the first ground layer 23; a second intermediate insulation layer 37 formed on the second ground layer 33 and the first intermediate insulation layer 27; a second via hole 38 formed in the second intermediate insulation layer 37, the second via hole 38 is communicated with the first via hole 28; and an electrode 29 formed on the second intermediate insulation layer 37. For example, a high voltage signal can be applied to the electrode 29 and applied to the source and drain electrodes through the via hole. In addition, another active layer, such as an a-Si layer, may be formed on the second intermediate insulation layer 37 and the electrode.

Figure 5:
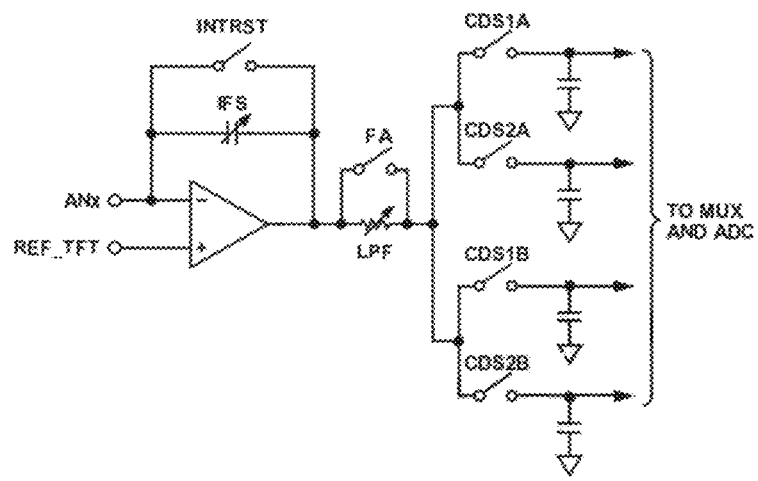
FIG. 5 is a signal readout circuit diagram of an embodiment of the present disclosure.

In addition, the pixel structure may also include a signal readout circuit, as shown in FIG. 5. For example, for an AD71124, the signal readout circuit performs signal integration and amplification, signal double sampling and ADC conversion through an integrated circuit IC. The signal readout circuit is connected to the signal amplification circuit in FIG. 1 through Anx. For example, as a peripheral hardware, the signal readout circuit can be accessed from Data in FIG. 1A. The signal readout circuit is connected to the data signal line. The signal reading circuit can read the voltage signal on the data signal line and transmit the voltage signal to the terminal, and the terminal can convert the voltage signal into an image signal for viewing.

An embodiment of the present disclosure also provides a flat panel detection device. The flat panel detection device may include the pixel structure of the flat panel detection device described in any one of the foregoing examples.

An embodiment of the present disclosure also provides a camera system, which includes the above-mentioned flat panel detection device. The camera system may be a CCD camera system or a CMOS camera system. This camera system can be applied to medical examinations. The flat panel detection device can transmit the detected voltage signals to a corresponding terminal (e.g., a computer), which can convert the electrical signals into image signals and display the corresponding images for viewing.

The pixel structure of the flat panel detection device, the flat panel detection device and the camera system provided by the present disclosure include a photodiode, a first switching transistor, and a signal amplification circuit connected to the photodiode and the first switching transistor. The photodiode works under the action of a reverse voltage, and the photodiode can convert the collected optical signals into electrical signals, that is, when exposed to light, the photodiode will produce hole electron pairs. Under the action of an external bias field, the electron and hole pairs move in opposite directions to form a current, and this current forms stored charges in the storage capacitor of the photodiode. When the scan signal causes the first switching transistor to be turned on, the photodiode can output a given voltage signal to the signal amplification circuit, and this voltage signal can be output to the data line after being amplified by the signal amplification circuit. In other words, in this process, the signal amplification circuit is provided between the photodiode and the first switching transistor to increase the actual signal output to the data line, that is, the detection signal of the flat panel detection device is increased, which is beneficial to improve the signal-to-noise ratio of the flat panel detection device, so that the detection effect of the flat panel detection device is improved and then the quality of the obtained images is improved.

The above are only exemplary embodiments of the present disclosure, and the scope of the present disclosure is not limited thereto. Any changes or substitutions that can be readily thought of by one of ordinary skill in the art within the technical scope disclosed in the embodiments of the present disclosure shall fall in the scope of the present disclosure.

What is claimed is:

1. A pixel structure of a flat panel detection device, comprising:
   a photodiode configured to collect optical signals and convert the optical signals into electrical signals, the photodiode comprises a positive terminal and a negative terminal, and the negative terminal is connected to a bias voltage signal terminal;
   a signal amplification circuit, a signal input terminal of the signal amplification circuit is connected to the positive terminal of the photodiode, and a signal output terminal of the signal amplification circuit is connected to a first node; and a first switching transistor, a control electrode of the first switching transistor is connected to a scanning signal line, a first terminal of the first switching transistor is connected to a data signal line, and a second terminal of the first switching transistor is connected to the first node, wherein the signal amplification circuit comprises:

a second switching transistor, a control electrode of the second switching transistor is connected to a first voltage signal terminal, a first terminal of the second switching transistor is connected to a second voltage signal terminal, a second terminal of the second switching transistor is connected to a second node, and the second node and the first node are connected together to become one node;

a third switching transistor, a control electrode of the third switching transistor is connected to the second node, and a first terminal of the third switching transistor is the signal input terminal of the signal amplification circuit; and a bootstrap circuit, one terminal of the bootstrap circuit is connected to the second terminal of the third switching transistor, and the other terminal of the bootstrap circuit is the signal output terminal of the signal amplification circuit.

2. The pixel structure according to claim 1, wherein the bootstrap circuit is a capacitor.

3. The pixel structure according to claim 2, wherein the photodiode is a metal-semiconductor-metal type photodiode structure.

4. The pixel structure according to claim 3, wherein the third switching transistor is an n-type thin film transistor.

5. The pixel structure according to claim 4, wherein the photodiode is a PIN-type photodiode structure.

6. The pixel structure according to claim 5, wherein the PIN-type photodiode structure comprises:
a substrate;
a gate electrode formed on the substrate;
a gate insulating layer formed on the gate electrode;
an active layer formed on the gate insulating layer corresponding to a position of the gate electrode;
a source-drain layer formed on the active layer;
a first passivation layer formed on the source-drain layer;
a second source-drain layer formed on the first passivation layer;
a PIN junction formed on the second source-drain layer;
an ITO cover layer formed on the PIN junction;
an intermediate insulation layer formed on the ITO cover layer;
a second passivation layer formed on the intermediate insulation layer;
a shielding layer formed on the second passivation layer; and
a protective layer formed on the shielding layer,
wherein an X-ray conversion layer is formed on the protective layer.

7. The pixel structure according to claim 5, wherein the third switching transistor is a p-type thin film transistor.

8. The pixel structure according to claim 7, further comprising an X-ray conversion layer disposed on the photodiode, and the X-ray conversion layer is configured to convert an X-ray into an optical signal.

9. The pixel structure according to claim 1, wherein the photodiode is a metal-semiconductor-metal type photodiode structure.

10. The pixel structure according to claim 9, wherein the metal-semiconductor-metal type photodiode structure comprises:
a substrate;
a gate electrode and a first ground layer formed on the substrate;
a gate insulating layer formed on the gate electrode and the first ground layer;
a first active layer formed on the gate insulating layer corresponding to the gate electrode;
a source-drain layer formed on the first active layer;
a first intermediate insulation layer formed on the source-drain layer;
a first via hole formed in the first intermediate insulation layer;
a second ground layer formed on the first intermediate insulation layer;
a second intermediate insulation layer formed on the second ground layer and the first intermediate insulation layer;
a second via hole formed in the second intermediate insulation layer, and the second via hole is communicated with the first via hole;
an electrode formed on the second intermediate insulation layer; and
a second active layer formed on the second intermediate insulation layer and the electrode.

11. The pixel structure according to claim 1, wherein the third switching transistor is an n-type thin film transistor.

12. The pixel structure according to claim 1, wherein the photodiode is a PIN-type photodiode structure.

13. The pixel structure according to claim 12, wherein the PIN-type photodiode structure comprises:
a substrate;
a gate electrode formed on the substrate;
a gate insulating layer formed on the gate electrode;
an active layer formed on the gate insulating layer corresponding to a position of the gate electrode;
a source-drain layer formed on the active layer;
a first passivation layer formed on the source-drain layer;
a second source-drain layer formed on the first passivation layer;
a PIN junction formed on the second source-drain layer;
an ITO cover layer formed on the PIN junction;
an intermediate insulation layer formed on the ITO cover layer;
a second passivation layer formed on the intermediate insulation layer;
a shielding layer formed on the second passivation layer; and
a protective layer formed on the shielding layer,
wherein an X-ray conversion layer is formed on the protective layer.

14. The pixel structure according to claim 1, wherein the third switching transistor is a p-type thin film transistor.

15. The pixel structure according to claim 1, further comprising an X-ray conversion layer disposed on the photodiode, and the X-ray conversion layer is configured to convert an X-ray into an optical signal.

16. The pixel structure according to claim 15, wherein the X-ray conversion layer is made of gadolinium oxysulfide or cesium iodide material.

17. The pixel structure according to claim 1, further comprising a signal readout circuit, and the signal readout circuit is connected to the data signal line.

18. A flat panel detection device, comprising a pixel structure, wherein the pixel structure comprises:
- a photodiode configured to collect optical signals and convert the optical signals into electrical signals, the photodiode comprises a positive terminal and a negative terminal, and the negative terminal is connected to a bias voltage signal terminal;
- a signal amplification circuit, a signal input terminal of the signal amplification circuit is connected to the positive terminal of the photodiode, and a signal output terminal of the signal amplification circuit is connected to a first node; and
- a first switching transistor, a control electrode of the first switching transistor is connected to a scanning signal line, a first terminal of the first switching transistor is connected to a data signal line, and a second terminal of the first switching transistor is connected to the first node,
- wherein the signal amplification circuit comprises:
  - a second switching transistor, a control electrode of the second switching transistor is connected to a first voltage signal terminal, a first terminal of the second switching transistor is connected to a second voltage signal terminal, a second terminal of the second switching transistor is connected to a second node, and the second node and the first node are connected together to become one node;
  - a third switching transistor, a control electrode of the third switching transistor is connected to the second node, and a first terminal of the third switching transistor is the signal input terminal of the signal amplification circuit; and
  - a bootstrap circuit, one terminal of the bootstrap circuit is connected to the second terminal of the third switching transistor, and the other terminal of the bootstrap circuit is the signal output terminal of the signal amplification circuit.

19. A camera system, comprising a flat panel detection device, wherein the flat panel detection device comprises:
- a pixel structure, wherein the pixel structure comprises:
  - a photodiode configured to collect optical signals and convert the optical signals into electrical signals, the photodiode comprises a positive terminal and a negative terminal, and the negative terminal is connected to a bias voltage signal terminal;
  - a signal amplification circuit, a signal input terminal of the signal amplification circuit is connected to the positive terminal of the photodiode, and a signal output terminal of the signal amplification circuit is connected to a first node; and
  - a first switching transistor, a control electrode of the first switching transistor is connected to a scanning signal line, a first terminal of the first switching transistor is connected to a data signal line, and a second terminal of the first switching transistor is connected to the first node,
- wherein the signal amplification circuit comprises:
  - a second switching transistor, a control electrode of the second switching transistor is connected to a first voltage signal terminal, a first terminal of the second switching transistor is connected to a second voltage signal terminal, a second terminal of the second switching transistor is connected to a second node, and the second node and the first node are connected together to become one node;
  - a third switching transistor, a control electrode of the third switching transistor is connected to the second node, and a first terminal of the third switching transistor is the signal input terminal of the signal amplification circuit; and
  - a bootstrap circuit, one terminal of the bootstrap circuit is connected to the second terminal of the third switching transistor, and the other terminal of the bootstrap circuit is the signal output terminal of the signal amplification circuit.

* * * * *